United States Patent
Kim et al.

(10) Patent No.: US 10,838,552 B2
(45) Date of Patent: Nov. 17, 2020

(54) TOUCH SENSOR FALSE DETECTION PREVENTING STRUCTURE AND ELECTRONIC DEVICE HAVING SAME

(71) Applicant: ALPS ALPINE CO., LTD., Tokyo (JP)

(72) Inventors: Younghoon Kim, Gwangju (KR); Tomoaki Tsuchiya, Miyagi (JP); Tomoya Sasaki, Miyagi (JP); Shinya Abe, Miyagi (JP); Yasunori Watanabe, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/407,402

(22) Filed: May 9, 2019

(65) Prior Publication Data

US 2019/0265838 A1    Aug. 29, 2019

Related U.S. Application Data

(63) Continuation of application No. PCT/JP2017/040499, filed on Nov. 9, 2017.

(30) Foreign Application Priority Data

Dec. 5, 2016    (KR) .......................... 10-2016-0164165

(51) Int. Cl.
    *G06F 3/041*    (2006.01)
    *G06F 1/16*     (2006.01)
    (Continued)

(52) U.S. Cl.
    CPC .......... *G06F 3/0418* (2013.01); *G06F 1/1643* (2013.01); *G06F 3/04164* (2019.05); *H05K 1/0218* (2013.01); *H05K 1/11* (2013.01)

(58) Field of Classification Search
    None
    See application file for complete search history.

(56) References Cited

U.S. PATENT DOCUMENTS

2011/0003622 A1*  1/2011  Hwang ................ H05K 1/0215
                                                         455/575.1
2012/0327328 A1* 12/2012  Kim .................. G02F 1/133308
                                                         349/59

(Continued)

FOREIGN PATENT DOCUMENTS

JP    2008-071239       3/2008
JP    2013-077271       4/2013
KR    10-2006-0108999  10/2006

OTHER PUBLICATIONS

International Search Report dated Jan. 9, 2018 in PCT/JP2017/040499 filed on Nov. 9, 2017.

*Primary Examiner* — Christopher R Lamb
(74) *Attorney, Agent, or Firm* — IPUSA, PLLC

(57) ABSTRACT

A touch sensor false detection preventing structure for use in an electronic device is provided. The electronic device includes a housing that is provided with a through-hole provided area through which a sensor sheet passes, a circuit board that is mounted inside the housing, and a touch panel that is electrically connected to the circuit board by the sensor sheet. The touch sensor false detection preventing structure includes protruding portions formed on an inner surface at both ends of the through-hole provided area in planar view so as to protrude a predetermined distance, such that movement at a part of both side ends of the sensor sheet is restricted.

12 Claims, 8 Drawing Sheets

(51) Int. Cl.
*H05K 1/02* (2006.01)
*H05K 1/11* (2006.01)

(56) References Cited

U.S. PATENT DOCUMENTS

| | | | |
|---|---|---|---|
| 2013/0082925 A1 | 4/2013 | Sato | |
| 2013/0207669 A1* | 8/2013 | Shinoda | G06F 3/0202 |
| | | | 324/609 |
| 2017/0010638 A1* | 1/2017 | Park | G06F 3/0416 |
| 2017/0185206 A1* | 6/2017 | Houde | G06F 3/0416 |
| 2017/0235342 A1* | 8/2017 | Brown | G06F 1/1658 |
| | | | 361/679.3 |

* cited by examiner

CROSS-SECTIONAL VIEW TAKEN THROUGH LINE A-A'

US 10,838,552 B2

TOUCH SENSOR FALSE DETECTION PREVENTING STRUCTURE AND ELECTRONIC DEVICE HAVING SAME

CROSS-REFERENCE TO RELATED APPLICATIONS

This application is a continuation of International Application No. PCT/JP2017/040499 filed on Nov. 9, 2017, and designating the U.S., which claims priority to Korean Patent Application No. 10-2016-0164165 filed on Dec. 5, 2016. The contents of these applications are incorporated herein by reference in their entirety.

BACKGROUND OF THE INVENTION

1. Field of the Invention

The disclosures herein generally relate to a touch sensor false detection preventing structure and an electronic device having the same, and specifically relate to a touch sensor false detection preventing structure and an electronic device having the same that prevent a touch sensor from accidentally detecting a touch when the electronic device is moved while in operation.

2. Description of the Related Art

FIG. 1 is a schematic cross-sectional view illustrating a part of a conventional electronic device having a touch sensor. FIG. 2 is a schematic plan view illustrating a through-hole and a sensor sheet in the related art illustrated in FIG. 1. FIG. 3 is a schematic cross-sectional view illustrating an example in which, when a touch panel illustrated in FIG. 1 is in operation, the sensor sheet is moved and makes contact with the inner surface of the through-hole.

A conventional electronic device 10 having a touch sensor includes a number of elements such as a touch panel 14 as illustrated in FIG. 1.

Specifically, the conventional electronic device 10 includes a housing 11 provided with a through-hole provided area 15 through which a sensor sheet 13 passes, a circuit board 12 mounted inside the housing 11, and the touch panel 14 electrically connected to the circuit board 12 by the sensor sheet 13.

In the conventional electronic device 10, the touch panel 14 is disposed above one side of the housing 11 in a vertically movable manner as desired, and a switching support 18 is disposed below the touch panel 14 and extends a predetermined length in a direction toward a switching member 17 that is mounted above the circuit board 12.

In the above-described electronic device 10, the sensor sheet 13 is moved by the vertically movable touch panel 14. At this time, as illustrated in FIG. 3, the sensor sheet 13 may come into contact with the inner surface of the through-hole provided area 15. In this case, the sensor sheet 13 may accidentally detect a touch, leading to a malfunction of the electronic device 10.

More specifically, a number of electrode patterns for detecting a touch signal are formed on the sensor sheet 13. When the electrode patterns make contact with the inner surface of the through-hole provided area 15, an incorrect touch signal is generated.

Accordingly, a technique that solves the above-described problem with the traditional electronic device having the touch sensor is desired.

RELATED-ART DOCUMENTS

Patent Documents

[PATENT DOCUMENT 1] Korean Laid-open Patent Publication No. 10-2006-0108999 (Date of publication: Oct. 19, 2006)

SUMMARY OF THE INVENTION

It is an object of the present invention to provide a touch sensor false detection preventing structure and an electronic device having the same that prevent the touch sensor from accidentally detecting a touch when the electronic device is moved while in operation.

According to at least one embodiment, a touch sensor false detection preventing structure for use in an electronic device is provided. The electronic device includes a housing that is provided with a through-hole provided area through which a sensor sheet passes, a circuit board that is mounted inside the housing, and a touch panel that is electrically connected to the circuit board by the sensor sheet. The touch sensor false detection preventing structure includes protruding portions formed on an inner surface at both ends of the through-hole provided area in planar view so as to protrude a predetermined distance, such that movement at a part of both side ends of the sensor sheet is restricted.

Other objects and further features of the present invention will be apparent from the following detailed description when read in conjunction with the accompanying drawings.

DESCRIPTION OF THE EMBODIMENTS

According to a touch sensor false detection preventing structure of an embodiment of the present invention, a through-hole provided area and protruding portions having a specific structure are provided, thereby preventing a touch sensor from accidentally detecting a touch when an electronic device is moved while in operation.

Further, according to the touch sensor false detection preventing structure of the embodiment of the present invention, ground patterns and electrode patterns are provided at specific positions of a sensor sheet, and also the protruding portions are provided at specific positions of the through-hole, such that the protruding portions make contact with the ground patterns. With the above configuration, it is possible to prevent the electrode patterns of the sensor sheet from contacting the inner surface of the through-hole. As a result, accidental touch detection can be prevented.

Further, according to the touch sensor false detection preventing structure of the embodiment of the present invention, the through-hole that extends a predetermined length in the direction perpendicular to the upper surface of a circuit board, and also the protruding portions are provided. With the above configuration, it is possible to prevent the electrode patterns formed on the sensor sheet from contacting the inner surface of the through-hole. As a result, accidental touch detection can be prevented.

Further, according to the electronic device of the embodiment of the present invention, by providing the touch sensor false detection preventing structure, it is possible to prevent the touch sensor from accidentally detecting a touch when the electronic device is moved while in operation.

In the following, embodiments of the present invention will be described with reference to the accompanying drawings.

First, terms used herein and in the claims should not be restrictively interpreted as ordinary meanings or dictionary-based meanings, and should be interpreted as meanings conforming to the technical ideas of the present invention.

It should be noted that when a member is described herein as being provided "on" another member, this means not only that the member is in contact with the other member, but that an additional member is interposed between the two members. Further, when a member is described herein as "including" an element, this does not mean that other elements are excluded, and means that other elements may be further included, unless stated to the contrary.

Figure 1:
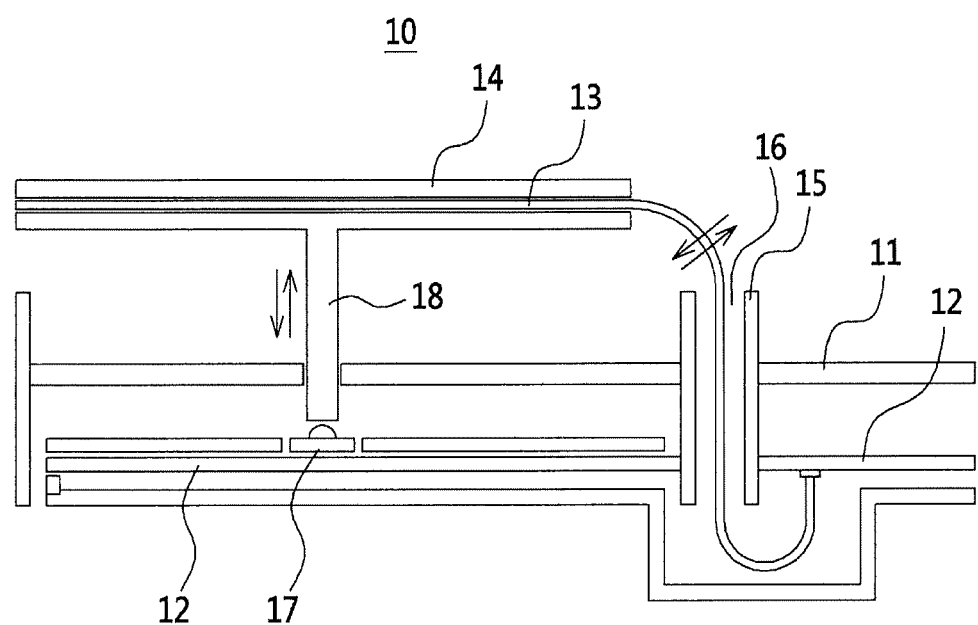
FIG. 1 is a schematic cross-sectional view illustrating a part of a conventional electronic device having a touch sensor.
Figure 2:
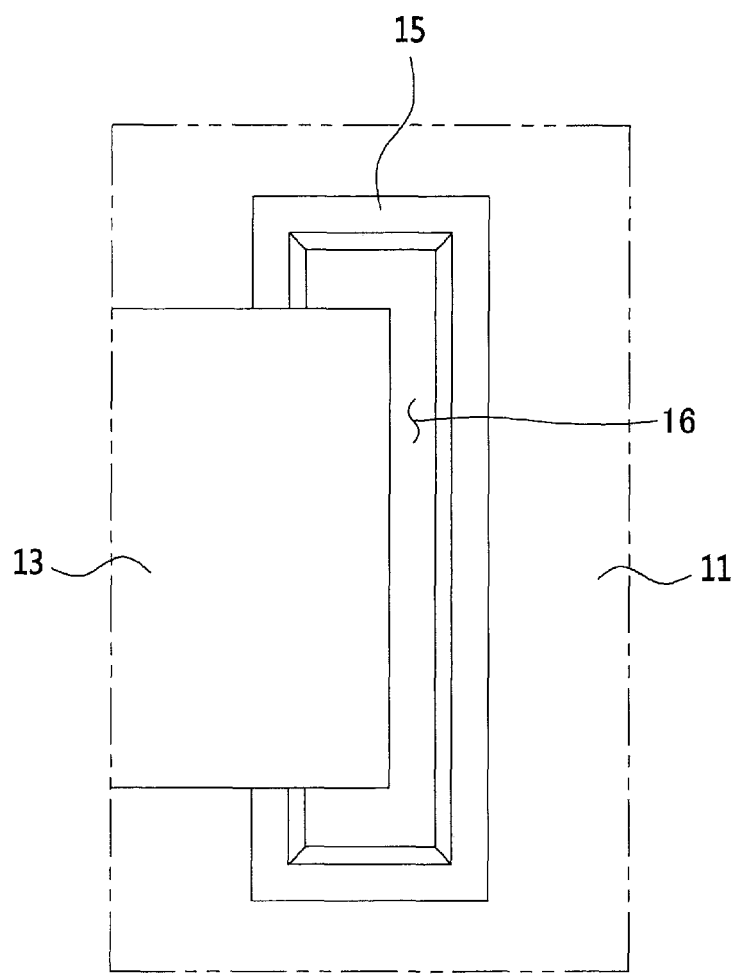
FIG. 2 is a schematic plan view illustrating a through-hole and a sensor sheet in the related art illustrated in FIG. 1.
Figure 3:
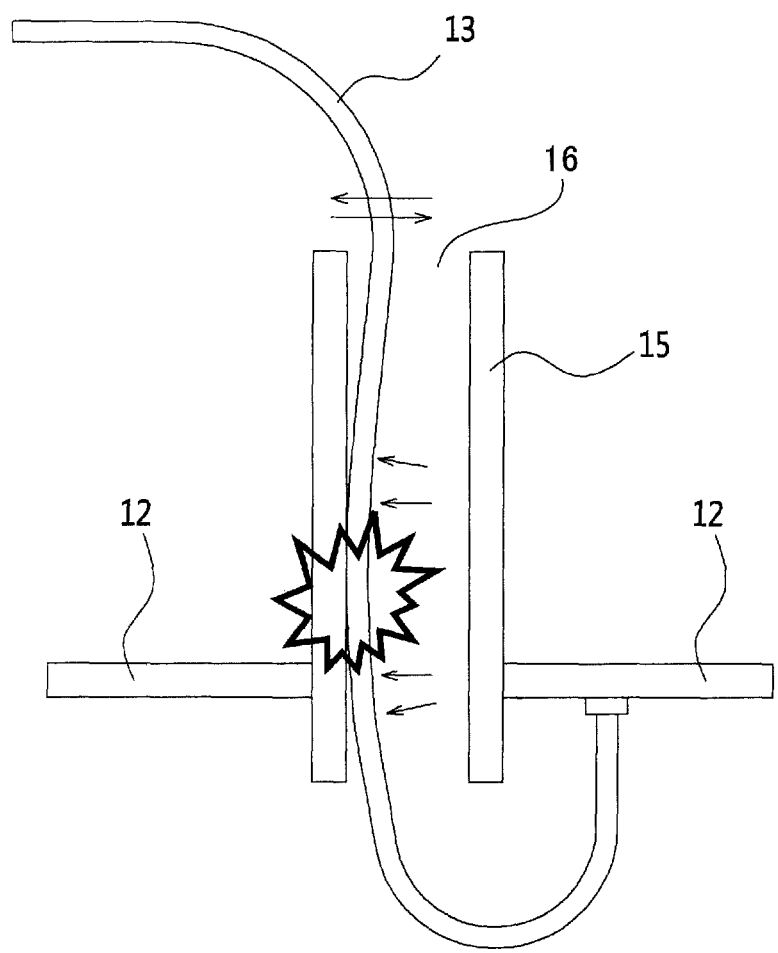
FIG. 3 is a schematic cross-sectional view illustrating an example in which, when a touch panel illustrated in FIG. 1 is in operation, the sensor sheet is moved and makes contact with the inner surface of the through-hole.
Figure 4:
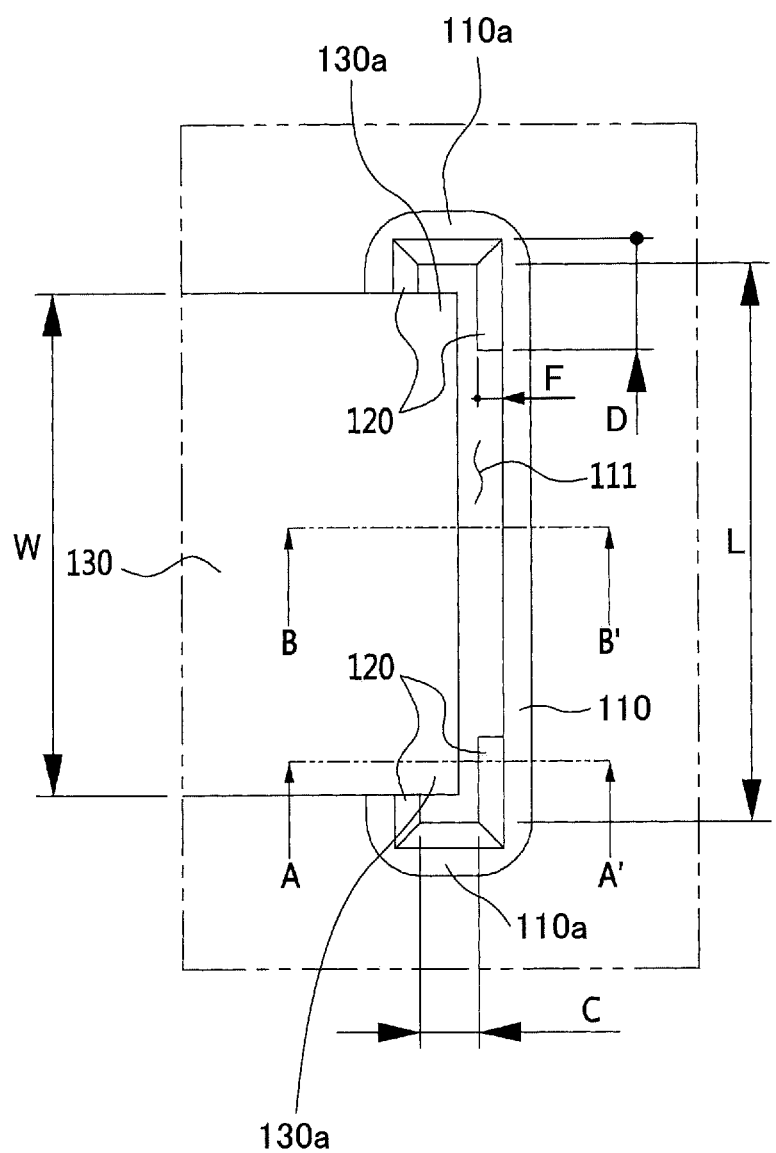
FIG. 4 is a schematic plan view illustrating a through-hole and a sensor sheet according to one embodiment of the present invention.
Figure 5:
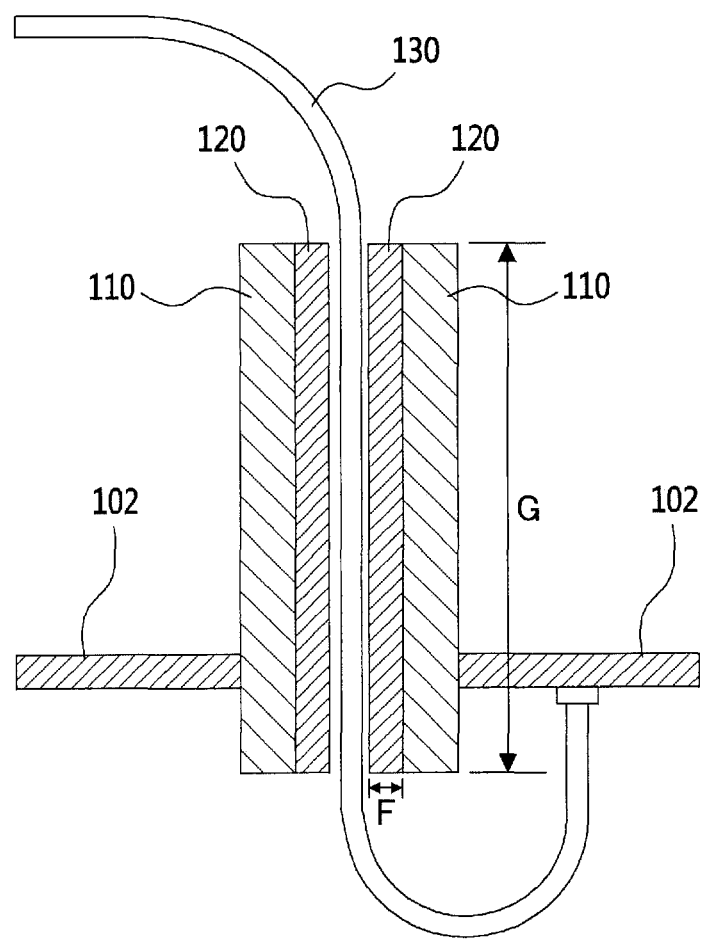
FIG. 5 is a cross-sectional view taken through line A-A' of FIG. 4.
Figure 6:
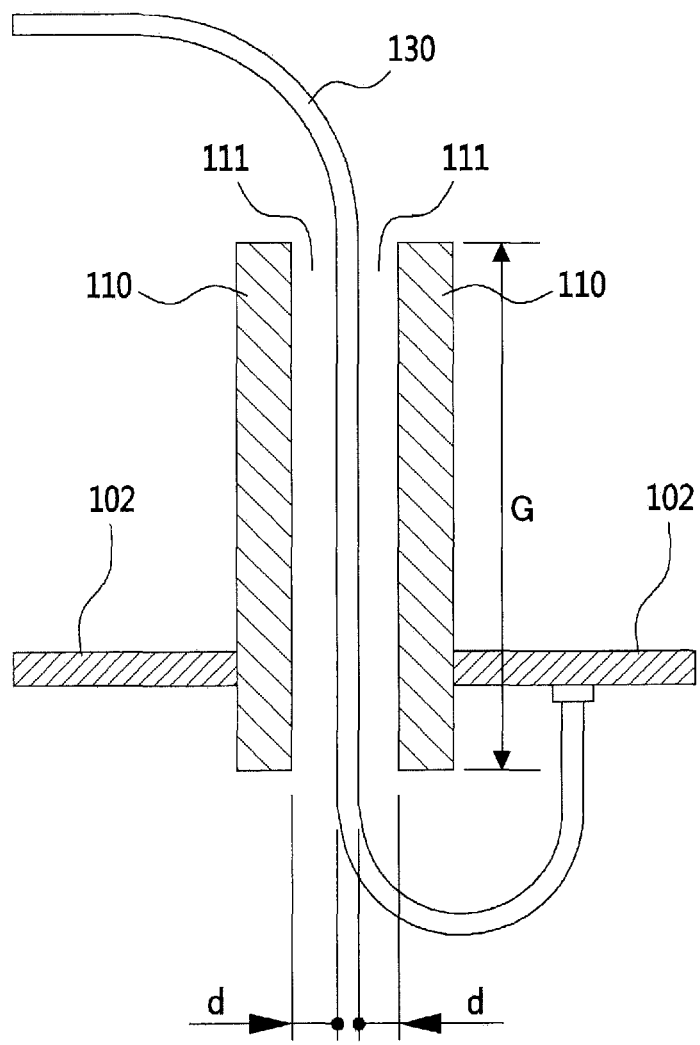
FIG. 6 is a cross-sectional view taken through line B-B' of FIG. 4.

FIG. 4 is a schematic plan view illustrating a through-hole and a sensor sheet according to one embodiment of the present invention. FIG. 5 is a cross-sectional view taken through line A-A' of FIG. 4. FIG. 6 is a cross-sectional view taken through line B-B' of FIG. 4.

A touch sensor false detection preventing structure 100 according to the present embodiment for use in an electronic device is provided. The electronic device includes a housing 101 provided with a through-hole provided area 110 through which a sensor sheet 130 passes, a circuit board 102 mounted inside the housing 101, and a touch panel 103 electrically connected to the circuit board 102 by the sensor sheet 130. In the touch sensor false detection preventing structure 100, the through-hole provided area 110 and protruding portions 120 having a specific structure are provided, thereby preventing a touch sensor from accidentally detecting a touch when the electronic device is moved while in operation.

In the following, each element configuring the touch sensor false detection preventing structure 100 according to the present embodiment will be described in detail with reference to the drawings.

A through-hole 111 of the through-hole provided area 110 according to the present embodiment has a rectangular shape in planar view and has a length L corresponding to a width W of the sensor sheet 130. Further, the protruding portions 120 are preferably formed at the four corners of the through-hole 111 in planar view.

The protruding portions 120 according to the present embodiment are formed on the inner surface at both ends 110a of the through-hole provided area 110 in planar view so as to protrude a predetermined distance F, such that the movement at a part of both side ends 130a of the sensor sheet 130 is restricted.

Further, the through-hole provided area 110 is formed so as to extend a predetermined length G in a direction perpendicular to the upper surface of the circuit board 102.

Further, the protruding portions 120, formed on the inner surface at the both ends 110a of the through-hole provided area 110 in planar view, may vertically extend to a length corresponding to the extension length G of the through-hole 111.

Further, as illustrated in FIG. 4, the length L of the through-hole 111 of the through-hole provided area 110 is preferably from 105% to 115% of the width W of the sensor sheet 130. If the length L of the through-hole 111 exceeds 115% of the width W of the sensor sheet 130, the movement in the width direction of the sensor sheet 130 cannot be stably restricted, which is not preferable. Conversely, if the length L of the through-hole 111 is less than 105% of the width W of the sensor sheet 130, the movement in the width direction of the sensor sheet 130 is excessively restricted, causing the movement of the touch panel 103 to be restricted.

Figure 7:
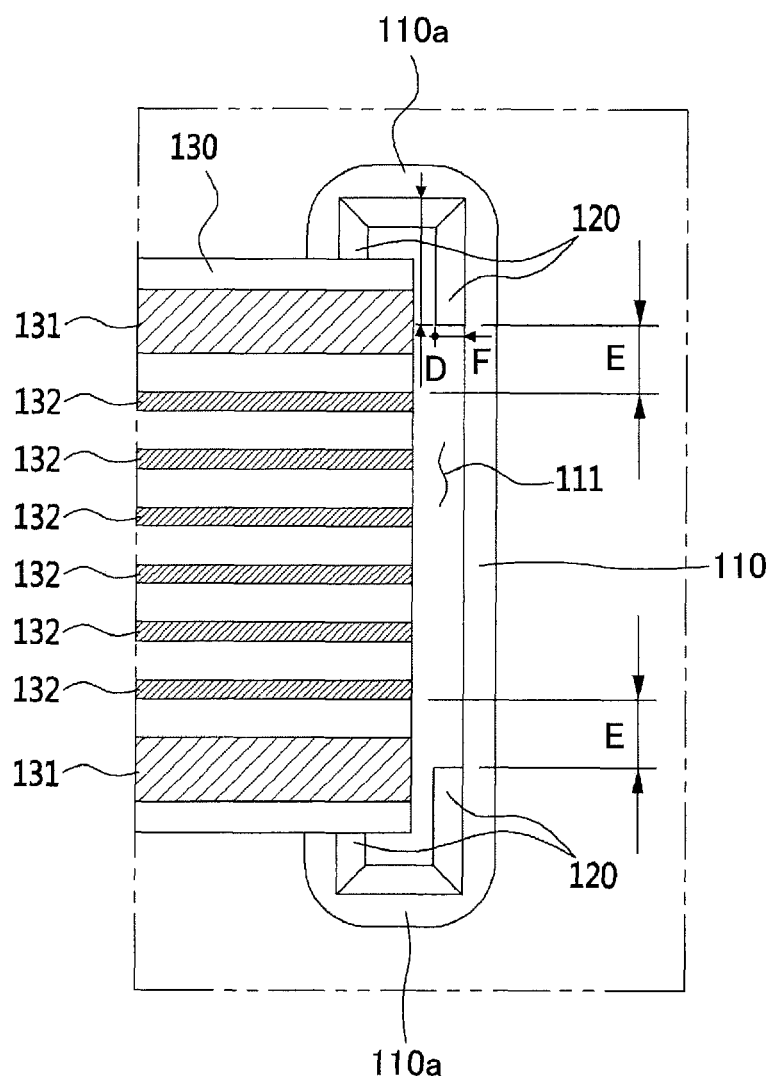
FIG. 7 is a schematic plan view illustrating the through-hole, the sensor sheet, and ground patterns and electrode patterns formed on the sensor sheet according to the embodiment of the present invention.
Figure 8:
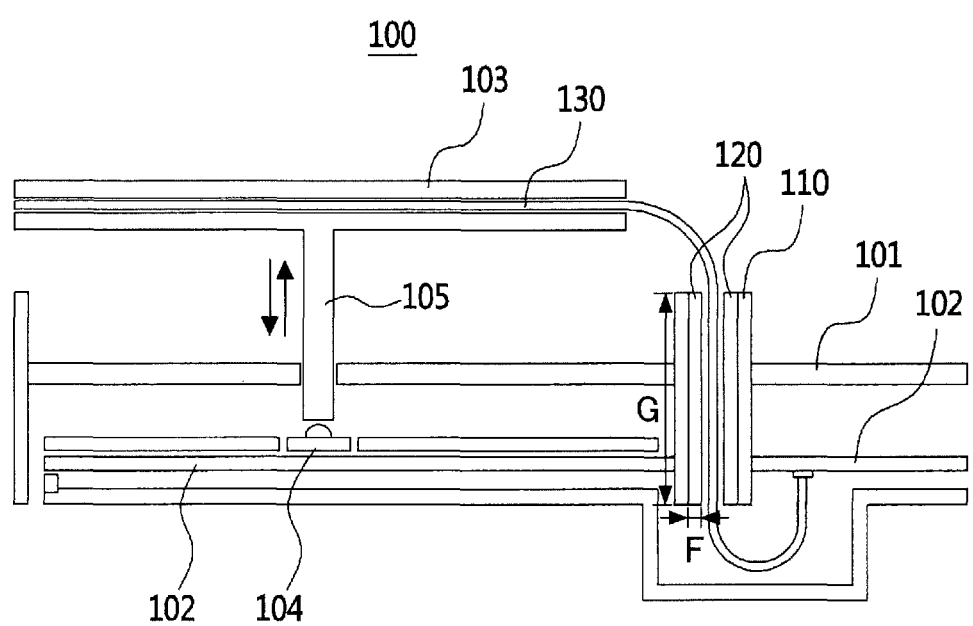
FIG. 8 is a schematic cross-sectional view illustrating a touch sensor false detection preventing structure according to the embodiment of the present invention.

FIG. 7 is a schematic plan view illustrating the through-hole, the sensor sheet, and ground patterns and electrode patterns formed on the sensor sheet according to the embodiment of the present invention. FIG. 8 is a schematic cross-sectional view illustrating a touch sensor false detection preventing structure according to the embodiment of the present invention.

Referring to FIGS. 7 and 8 together with FIGS. 4 through 6, the sensor sheet 130 according to the present embodiment has a structure in which ground patterns (ground patterns) 131 and electrode patterns (electrode patterns) 132 are formed.

Specifically, as illustrated in FIG. 7, the ground patterns 131 of the sensor sheet 130 are formed on the respective side ends of the sensor sheet 130, and the electrode patterns 132 are preferably formed between the two ground patterns 131, which are formed on the respective side ends of the sensor sheet 130, and are preferably spaced a predetermined distance apart from the two ground patterns 131.

Further, as illustrated in FIG. 4 and FIG. 7, the protruding portions 120 according to the present embodiment, formed on the inner surface at the both ends 110a of the through-hole provided area 110 in planar view, may have a predetermined length D, such that the protruding portions 120 may contact at least part of the ground patterns 131 of the sensor sheet 130.

Further, as illustrated in FIG. 7, the protruding portions 120 according to the present embodiment may each be preferably formed 1.0 mm to 2.0 mm (E) apart from the corresponding outermost electrode pattern 132 of the sensor sheet 130.

As illustrated in FIG. 8, the touch sensor false detection preventing structure 100 according to the present embodiment may include the touch panel 103 vertically movably disposed above one side of the housing 101 as desired.

In this case, by disposing a switching support 105 below the touch panel 103 to extend a predetermined length in a direction toward a switching member 104 mounted above the circuit board 102, a push operation in the vertical direction is achieved.

The protruding portions 120 formed on the inner surface at the both ends 110a of the through-hole provided area 110 in planar view allow the electrode patterns 132 to be spaced a predetermined distance d apart from the inner surface of the through-hole 111 (see FIG. 6). Thus, when the push operation is performed in accordance with the user's intention, and thereby the touch panel 103 is moved, the protruding portions 120 prevent contact between the electrode patterns 132 and the inner surface of the through-hole 111. Accordingly, accidental touch detection can be prevented.

Further, the electronic device having the touch sensor false detection preventing structure 100 according to the present embodiment may be provided.

As described above, according to the touch sensor false detection preventing structure 100 of the embodiment of the present invention, the through-hole provided area 110 and the protruding portions 120 having a specific structure can prevent the touch sensor from accidentally detecting a touch when the electronic device is moved.

Further, according to the touch sensor false detection preventing structure 100 of the embodiment of the present invention, the ground patterns 131 and the electrode patterns 132 of the sensor sheet 130 are disposed at specific positions, and the protruding portions 120 of the through-hole 111 are disposed at specific positions, such that the protruding portions 120 make contact with the ground patterns 131. Thus, even if the electronic device is moved while in operation, it is possible to prevent contact between the electrode patterns 132 of the sensor sheet 130 and the inner surface of the through-hole 111. Accordingly, accidental touch detection can be prevented.

Further, according to the touch sensor false detection preventing structure 100 of the embodiment of the present invention, the through-hole 111 that extends the predetermined length in the direction perpendicular to the upper surface of the circuit board 102 is provided, and the through-hole 111 is provided with the protruding portions 120. With the above configuration, it is possible to prevent the electrode patterns 132 formed on the sensor sheet 130 from making contact with the inner surface of the through-hole 111. Accordingly, accidental touch detection can be prevented.

Further, according to the touch sensor false detection preventing structure 100 of the embodiment of the present invention, when the electronic device is moved while in operation, it is possible to prevent the touch sensor from accidentally detecting a touch.

Although the present invention has been described with reference to the embodiments, the present invention is not limited to the above-described embodiments. Various variations and modifications may be made without departing from the scope of the present invention.

What is claimed is:

1. A touch sensor false detection preventing structure for use in an electronic device including
    a housing that is provided with a through-hole provided area through which a sensor sheet passes, said sensor sheet having a front surface and a back surface provided on an opposite side of the front surface,
    a circuit board that is mounted inside the housing, and
    a touch panel that is electrically connected to the circuit board by the sensor sheet,
    the touch sensor false detection preventing structure comprising,
    protruding portions formed on an inner surface at both ends of the through-hole provided area in planar view so as to protrude a predetermined distance toward each of the front and back surfaces, such that movement a part of both side ends of the sensor sheet is restricted,
    wherein the through-hole provided area is formed so as to penetrate the circuit board, and
    wherein the sensor sheet includes
        two ground patterns formed on the respective side ends of the sensor sheet, and
        an electrode pattern formed between the two ground patterns and spaced a predetermined distance apart from the two ground patterns.

2. The touch sensor false detection preventing structure according to claim 1, wherein a through-hole of the through-hole provided area has a rectangular shape in planar view and has a length corresponding to a width of the sensor sheet, and
    the protruding portions are formed at four corners of the through-hole in planar view.

3. The touch sensor false detection preventing structure according to claim 1, wherein the protruding portions formed on the inner surface at the both ends of the through-hole provided area in planar view have a predetermined length, so as to contact, at least in part, the respective ground patterns of the sensor sheet.

4. The touch sensor false detection preventing structure according to claim 3, wherein the protruding portions are spaced 1.0 mm to 2.0 mm apart from the electrode pattern of the sensor sheet.

5. The touch sensor false detection preventing structure according to claim 1, wherein the touch panel is vertically movably disposed above one side of the housing, and a switching support is disposed below the touch panel to extend a predetermined length in a direction toward a switching member that is mounted above the circuit board.

6. The touch sensor false detection preventing structure according to claim 1, wherein the through-hole provided area extends a predetermined length in a direction perpendicular to an upper surface of the circuit board.

7. The touch sensor false detection preventing structure according to claim 6, wherein the protruding portions formed on the inner surface at the both ends of the through-hole provided area in planar view vertically extend to a length corresponding to an extension length of a through-hole.

8. The touch sensor false detection preventing structure according to claim 1, wherein a length of a through-hole of the through-hole provided area in planar view is from 105% to 115% of a width of the sensor sheet.

9. The electronic device including the touch sensor false detection preventing structure according to claim 1.

10. The touch sensor false detection preventing structure according to claim 1, wherein the through-hole provided area is arranged so as to restrict the movement of the sensor sheet in a direction parallel to the touch panel by retaining both of the front and back surfaces of the sensor sheet that is arranged to be vertical to the touch panel within the through-hole provided area.

11. A touch sensor false detection preventing structure for use in an electronic device including
    a housing that is provided with a through-hole provided area through which a sensor sheet passes,
    a circuit board that is mounted inside the housing, and
    a touch panel that is electrically connected to the circuit board by the sensor sheet,
    the touch sensor false detection preventing structure comprising,
    protruding portions formed on an inner surface, at both ends of the through-hole provided area in a width direction of the through-hole provided area in planar view so as to protrude a predetermined distance, such that movement at a part of both side ends of the sensor sheet is restricted, wherein the through-hole provided area is formed so as to penetrate the circuit board, and wherein the sensor sheet includes two ground patterns formed on the respective side ends of the sensor sheet, and an electrode pattern formed between the two ground patterns and spaced a predetermined distance apart from the two ground patterns.

12. A touch sensor false detection preventing structure for use in an electronic device including a housing that is provided with a through-hole provided area through which a sensor sheet passes, said sensor sheet having a ground pattern, a circuit board that is mounted inside the housing, and a touch panel that is electrically connected to the circuit board by the sensor sheet, the touch sensor false detection preventing structure comprising, protruding portions formed on an inner surface at both ends of the through-hole provided area in planar view so as to protrude a predetermined distance toward the ground pattern, such that movement at a part of both side ends of the sensor sheet is restricted, wherein the through-hole provided area is formed so as to penetrate the circuit board, and wherein the sensor sheet includes two ground patterns formed on the respective side ends of the sensor sheet, and an electrode pattern formed between the two ground patterns and spaced a predetermined distance apart from the two ground patterns.

\* \* \* \* \*